(12) United States Patent
Morita et al.

(10) Patent No.: US 11,882,766 B2
(45) Date of Patent: Jan. 23, 2024

(54) THERMOELECTRIC CONVERSION MODULE

(71) Applicant: LINTEC CORPORATION, Tokyo (JP)

(72) Inventors: Wataru Morita, Saitama (JP); Kunihisa Kato, Warabi (JP); Yuta Seki, Kawasaki (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 17/913,522

(22) PCT Filed: Mar. 18, 2021

(86) PCT No.: PCT/JP2021/011112
§ 371 (c)(1),
(2) Date: Sep. 22, 2022

(87) PCT Pub. No.: WO2021/193358
PCT Pub. Date: Sep. 30, 2021

(65) Prior Publication Data
US 2023/0105392 A1 Apr. 6, 2023

(30) Foreign Application Priority Data
Mar. 27, 2020 (JP) .................................. 2020-058852

(51) Int. Cl.
*H10N 10/852* (2023.01)
*H10N 10/17* (2023.01)
*H10N 10/857* (2023.01)

(52) U.S. Cl.
CPC .......... *H10N 10/852* (2023.02); *H10N 10/17* (2023.02); *H10N 10/857* (2023.02)

(58) Field of Classification Search
CPC ..... H10N 10/852; H10N 10/17; H10N 10/857
See application file for complete search history.

(56) References Cited

U.S. PATENT DOCUMENTS

2017/0373240 A1* 12/2017 Kato ...................... H10N 10/17

FOREIGN PATENT DOCUMENTS

| JP | 2001326394 A | 11/2001 |
|---|---|---|
| JP | 2003174203 A | 6/2003 |
| JP | 2008182160 A | 8/2008 |
| JP | 2009141079 A | 6/2009 |
| JP | 2012227271 A | 11/2012 |
| WO | WO-2005124882 A1 | 12/2005 |
| WO | WO-2016104615 A1 | 6/2016 |
| WO | WO-2018168837 A1 | 9/2018 |

OTHER PUBLICATIONS

International Search Report dated May 11, 2021 in PCT/JP2021/011112 (with English translation), 6 pages.

* cited by examiner

*Primary Examiner* — Tae-Sik Kang
(74) *Attorney, Agent, or Firm* — Element IP, PLC

(57) ABSTRACT

A thermoelectric conversion module having a further improved thermoelectric performance is provided. The thermoelectric conversion module includes: a base material; and a thermoelectric element layer including a thermoelectric semiconductor composition, wherein the thermoelectric semiconductor composition includes a thermoelectric semiconductor material, a heat resistant resin A, and an ionic liquid and/or inorganic ionic compound, and wherein the base material has a thermal resistance of 0.35 K/W or less.

10 Claims, 3 Drawing Sheets

THERMOELECTRIC CONVERSION MODULE

TECHNICAL FIELD

The present invention relates to a thermoelectric conversion module.

BACKGROUND ART

In a related art, a thermoelectric conversion module has been employed as one of effective utilization means for recovering unused exhaust heat energy generated from fossil fuel resources used in buildings, factories, and the like as a heat source. Such a thermoelectric conversion module uses a thermoelectric conversion material having a thermoelectric effect such as a Seebeck effect or a Peltier effect, and directly converts thermal energy into electric energy.

As such a thermoelectric conversion module, a configuration of a so-called π-type thermoelectric conversion element is known. In the π-type thermoelectric conversion element, a pair of electrodes that are spaced apart from each other is provided on a substrate. And, for example, a P-type thermoelectric element is provided on one electrode and an N-type thermoelectric element is provided on the other electrode such that the thermoelectric elements are spaced apart from each other in a similar manner, and upper surfaces of the thermoelectric materials are each connected to electrodes of an opposing substrate. In addition, a configuration of a so-called in-plane type thermoelectric conversion element is known. The in-plane type thermoelectric conversion element includes P-type thermoelectric elements and N-type thermoelectric elements alternately provided on a substrate in an in-plane direction, and, for example, is formed by connecting lower parts of joints between the thermoelectric element pairs in series via the electrodes.

In recent years, there are demands for further improvements in thermoelectric performance, as well as improvement in bending performance, miniaturization and thickness reduction of thermoelectric conversion modules. In response to these demands, a resin material is used as a base material for a support used in a thermoelectric conversion module. (Patent Literatures 1 and 2 and the like).

CITATION LIST

Patent Literature

Patent Literature 1: WO 2016/104615
Patent Literature 2: JP 2008-182160 A

SUMMARY OF INVENTION

Technical Problem

A resin substrate such as a polyimide film or a polyamide film as a support for use in the thermoelectric conversion module is described in Patent Literature 1, and an insulating resin substrate such as a polyimide-based resin or a polysulfone-based resin as a base layer for use in a flexible substrate constituting the flexible thermoelectric conversion element is described in Patent Literature 2. Though these substrates have heat resistance and bending performance, their thermal conductivity is inherently low from the perspective of physical properties of resin-derived materials. For example, even when their thickness is reduced to a mechanical strength limit of thermoelectric conversion modules, thermal resistance cannot be sufficiently suppressed, which hinders further improvement in thermoelectric performance.

In light of the above, an object of the present invention is to provide a thermoelectric conversion module having a further improved thermoelectric performance.

Solution to Problem

As a result of diligent studies to solve the above problems, the present inventors have found a thermoelectric conversion module having thermoelectric performance further improved by using a base material having specific thermal resistance as a base material (hereinafter, sometimes referred to as "substrate") which is a support for a thermoelectric conversion element constituting a thermoelectric conversion module, and completed the present invention.

That is, the present invention is to provide the following (1) to (10).

(1) A thermoelectric conversion module including: a base material; and a thermoelectric element layer including a thermoelectric semiconductor composition, wherein the thermoelectric semiconductor composition includes a thermoelectric semiconductor material, a heat resistant resin A, and an ionic liquid and/or inorganic ionic compound, and wherein the base material has a thermal resistance of 0.35 K/W or less.

(2) The thermoelectric conversion module according to (1), wherein the base material includes an insulator.

(3) The thermoelectric conversion module according to (1) or (2), wherein the base material is flexible.

(4) The thermoelectric conversion module according to any one of (1) to (3), wherein the base material has a thermal conductivity of 0.5 W/m·K or greater.

(5) The thermoelectric conversion module according to any one of (1) to (4), wherein the base material has a thickness from 5 to 150 μm.

(6) The thermoelectric conversion module according to any one of (1) to (5), wherein the base material includes a glass fabric and a heat resistant resin B.

(7) The thermoelectric conversion module according to (6), wherein the glass fabric is a glass woven fabric.

(8) The thermoelectric conversion module according to (6), wherein the heat resistant resin B is an epoxy resin or a polyimide resin.

(9) The thermoelectric conversion module according to any one of (1) to (8), wherein the thermoelectric conversion module includes a π-type thermoelectric conversion element or an in-plane type thermoelectric conversion element.

(10) The thermoelectric conversion module according to (9), wherein a configuration of the π-type thermoelectric conversion element or the in-plane type thermoelectric conversion element is used for cooling.

Advantageous Effects of Invention

The present invention can provide a thermoelectric conversion module having a further improved thermoelectric performance.

DESCRIPTION OF EMBODIMENTS

Thermoelectric Conversion Module

The thermoelectric conversion module according to an embodiment of the present invention is a thermoelectric conversion module including: a base material; and a thermoelectric element layer including a thermoelectric semiconductor composition, wherein the thermoelectric semiconductor composition includes a thermoelectric semiconductor material, a heat resistant resin A, and an ionic liquid and/or inorganic ionic compound, and wherein the base material has a thermal resistance of 0.35 K/W or less.

In the thermoelectric conversion module according to an embodiment of the present invention, the thermal resistance of the base material, for example, as a support, of the thermoelectric conversion element constituting the thermoelectric conversion module is set to 0.35 K/W or less. This configuration can induce a larger temperature difference between both sides of the thermoelectric conversion module.

Note that the thermal resistance of the base material referred to herein is thermal resistance due to thermal conduction. When a thermal conductivity of a substance is denoted as λ [thermal conductivity of the base material] (W/m·K), a length of a heat flow path of thermal conduction is denoted as L [thickness of the base material] (m), and a cross-sectional area of the heat flow path of the thermal conduction is denoted as Ac [area of a cross section obtained by cutting the body perpendicularly to a thickness direction of the base material] (m²), thermal resistance Rc is expressed as Rc=L/λAc (K/W).

The base materials having the same heat flow path cross-sectional area Ac are subjected to the evaluation of the thermal resistance of the base material herein, and thus the thermal resistance substantially depends on the thermal conductivity of the base material and the thickness of the base material.

Figure 1:
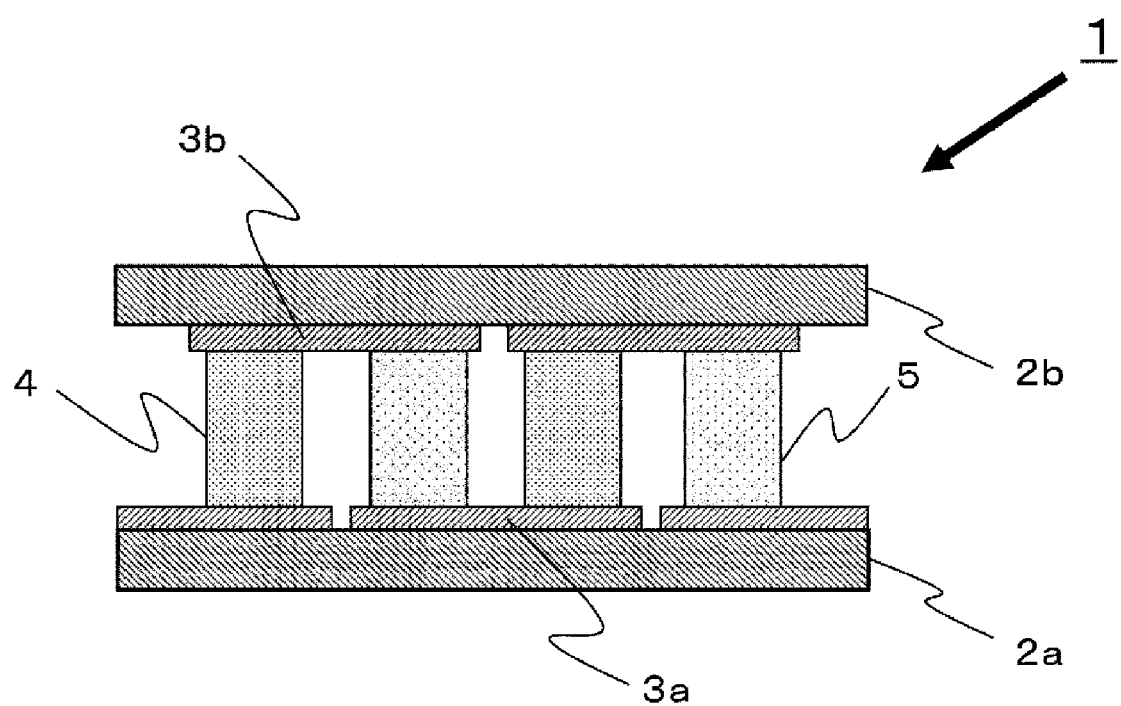
FIG. 1 is a cross-sectional diagram for illustrating an example of a configuration of a thermoelectric conversion module that includes a base material used in an embodiment of the present invention.

FIG. 1 is a cross-sectional diagram for illustrating an example of a configuration of a thermoelectric conversion module that includes a base material used in an embodiment of the present invention. A thermoelectric conversion module 1 is configured as a so-called π-type thermoelectric conversion element, and includes: a first base material 2a and an opposing second base material 2b; a P-type thermoelectric element layer 4 and an N-type thermoelectric element layer 5 formed between the first base material 2a and the opposing second base material 2b; a first electrode 3a formed on the first base material 2a; and a second electrode 3b formed on the opposing second base material 2b.

Figure 2:
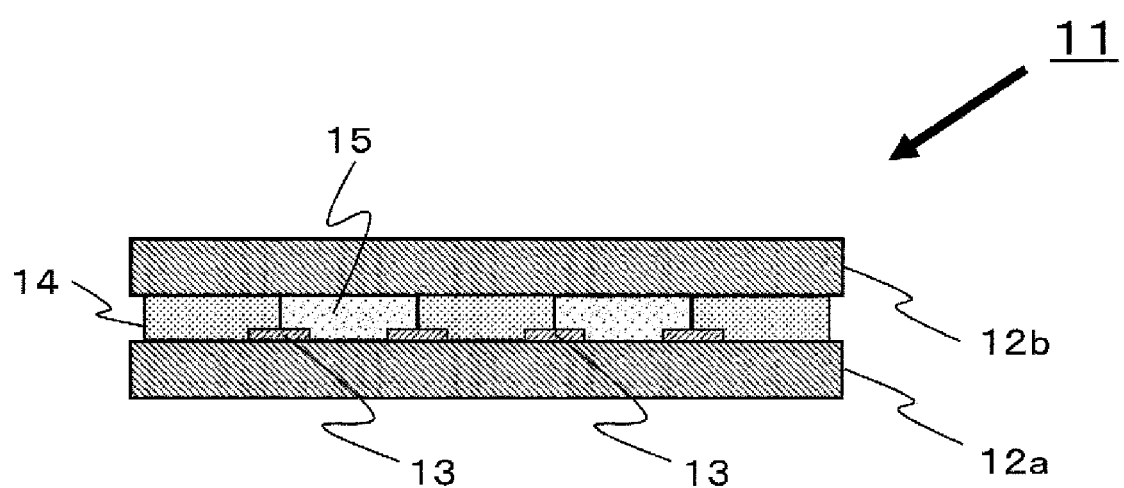
FIG. 2 is a cross-sectional diagram for illustrating another example of the configuration of the thermoelectric conversion module that includes the base material used in an embodiment of the present invention.

Similarly, FIG. 2 is a cross-sectional diagram for explaining another example of the configuration of the thermoelectric conversion module that includes the base material used in an embodiment of the present invention. A thermoelectric conversion module 11 is configured as a so-called in-plane type thermoelectric conversion element, and includes: a first base material 12a and an opposing second base material 12b; a P-type thermoelectric element layer 14 and an N-type thermoelectric element layer 15 formed between the first base material 12a and the opposing second base material 12b; and a first electrode 13 formed on the first base material 12a.

Base Material

The thermoelectric conversion module according to an embodiment of the present invention includes a base material. As described above, for example, when configured as a π-type thermoelectric conversion element, it preferably includes a second base material having a second electrode, the second base material being provided opposing the first base material having the first electrode. Also, when it is configured as an in-plane type thermoelectric conversion element, the second base material opposing the first base material having the first electrode may or may not include a base material. Further, the first base material and the second base material opposing the first base material may be identical or different, or a plurality of base materials may be used.

The thermal resistance of the base material used in an embodiment of the present invention is 0.35 K/W or less. When the thermal resistance is greater than 0.35 K/W, heat dissipation of the base material decreases, which leads to a reduction in thermoelectric performance. The thermal resistance is preferably 0.30 K/W or less, more preferably 0.20 K/W or less, and even more preferably 0.15 K/W or less. When the thermal resistance is within this range, the heat dissipation of the base material increases, which leads to improvement in thermoelectric performance.

The base material is not particularly limited as long as a thermoelectric element layer, an electrode, and the like can be formed and supported on a surface of the base material. The base material typically has flat front and back surfaces, and has a shape appropriately selected depending on the application. The shape is, for example, a rectangular parallelepiped shape, an elliptical columnar shape, or a cylindrical shape.

The thermal conductivity of the base material used in an embodiment of the present invention is preferably 0.5 W/m·K or greater, more preferably 1.5 W/m·K or greater, even more preferably from 2.5 to 30.0 W/m·K, and particularly preferably from 3.0 to 20.0 W/m·K. When the thermal conductivity is within this range, the thermal resistance value is easily adjusted to fall within the range defined in an embodiment the present invention, and the thermoelectric performance is improved.

The base material used in an embodiment of the present invention preferably includes an insulator. When the base material is an insulator, electrical effects on the thermoelectric element layer, the electrode, and the like can be suppressed, and the reduction in thermoelectric performance can be prevented.

Herein, the insulator refers to a material having a volume resistivity of $10^8$ Ω·m or greater.

A thickness of the base material is preferably from 5 to 150 μm, more preferably from 8 to 120 μm, even more preferably from 10 to 100 μm, and particularly preferably from 10 to 70 μm. When the thickness of the base material is within this range, the base material has mechanical strength as a support with respect to the thermoelectric element layer and the like, and the reduction in thermoelectric performance can be suppressed, which leads to improvement in thermoelectric performance.

The base material used in an embodiment of the present invention preferably includes a glass fabric and a heat resistant resin B from the perspective of flexibility and heat resistance.

Examples of the glass fabric include glass woven fabrics (glass cloths) and glass nonwoven fabrics. The glass woven fabric and nonwoven fabric may be used in combination.

Among these, a glass woven fabric is more preferred from the perspective of thermal conductivity improvement.

The glass woven fabric is a collection of glass fibers, in which yarns having glass fibers are bundled. Examples of weaving methods include weaving by plain weaving, basket weaving, satin weaving, twill weaving and the like. Among these, plain weaving is preferred from the perspective of thermal conductivity.

Examples of a glass material constituting the glass woven fabric include E glass, C glass, A glass, S glass, T glass, D glass, NE glass, quartz, and low dielectric constant glass. Among these, the glass material is preferably E glass, from the perspective of thermal conductivity and electrical insulating properties.

The heat resistant resin B is not particularly limited, and examples thereof include epoxy resins, polyamide-imide resins, and polyimide resins having crystalline or liquid crystalline properties. Among these, an epoxy resin or a polyimide resin is preferred from the perspective of heat resistance and versatility. Even more preferably, the epoxy resin is an epoxy resin. Examples of the epoxy resin include, but are not limited to, bisphenol-type, novolac-type, di cyclopentadiene-type, biphenyl-type, and tetrafunctional-type epoxy resins.

The base material may further include an inorganic filler. From the perspective of control of mechanical strength and thermal conductivity, and the like, the inorganic filler may include oxides such as titanium dioxide, aluminum hydroxide, aluminum oxide, magnesium oxide and silica, hydroxides such as magnesium hydroxide, nitrides such as boron nitride, aluminum nitride, and silicon nitride, and carbides such as silicon carbide and boron carbide, which can be used as appropriate.

Examples of commercially available base materials that satisfy the requirement for thermal resistance according to an embodiment of the present invention include a high thermal conductive substrate having a copper foil attached thereto (product name: CS-3295, available from RISHO KOGYO CO., LTD.). The high thermal conductive substrate, as a single component, is constituted of a glass woven fabric and an epoxy resin, has a thermal conductivity of 3.0 W/m·K which is a high value.

Production of the base material is not particularly limited. For example, the base material can be produced by impregnating the glass woven fabric with a high thermal conductive resin such as the epoxy resin and pre-drying it to produce a prepreg; cutting the prepreg into predetermined dimensions; then stacking a predetermined number of the cut products; in a case of a copper-clad laminate, placing a copper foil on the outside of the stacked product; and heating and applying pressure to the stacked product under predetermined conditions for integral molding of the stacked product.

The base material preferably has a 5% weight loss temperature of 250° C. or higher, and more preferably 400° C. or higher as measured by thermogravimetric analysis. The dimensional change rate due to heat as measured at 200° C. in accordance with JIS K7133 (1999) is preferably 0.5% or less, and more preferably 0.3% or less. The linear expansion coefficient in the planar direction as measured in accordance with JIS K7197 (2012) is from 0.1 ppm·° C.$^{-1}$ to 50 ppm·° C.$^{-1}$, and is more preferably from 0.1 ppm·° C.$^{-1}$ to 30 ppm·° C.$^{-1}$.

<Thermoelectric Element Layer>

The thermoelectric element layer used in an embodiment of the present invention includes a thermoelectric semiconductor composition containing a thermoelectric semiconductor material, a heat resistant resin A, and an ionic liquid and/or an inorganic ionic compound.

Thermoelectric Semiconductor Material

The thermoelectric semiconductor material used in the thermoelectric element layer is preferably pulverized to a predetermined size by a micropulverizer or the like and used as thermoelectric semiconductor particles (hereinafter, the thermoelectric semiconductor material may be referred to as "thermoelectric semiconductor particles").

The thermoelectric semiconductor material constituting the P-type thermoelectric element layer and the N-type thermoelectric element layer in the thermoelectric element layers used in an embodiment of the present invention is not particularly limited as long as the thermoelectric semiconductor material can generate thermoelectromotive force when a temperature difference is provided on the material. For example, bismuth-tellurium-based thermoelectric semiconductor materials such as P-type bismuth telluride and N-type bismuth telluride; telluride-based thermoelectric semiconductor materials such as GeTe and PbTe; antimony-tellurium-based thermoelectric semiconductor materials; zinc-antimony-based thermoelectric semiconductor materials such as ZnSb, $Zn_3Sb_2$, and $Zn_4Sb_3$; silicon-germanium-based thermoelectric semiconductor materials such as SiGe; bismuth selenide-based thermoelectric semiconductor materials such as $Bi_2Se_3$; silicide-based thermoelectric semiconductor materials such as $\beta$-$FeSi_2$, $CrSi_2$, $MnSi_{1.73}$, $Mg_2Si$; oxide-based thermoelectric semiconductor materials; Heusler materials such as FeVAl, FeVAlSi, and FeVTiAl; and sulfide-based thermoelectric semiconductor materials such as $TiS_2$ are used.

Among these materials, the thermoelectric semiconductor material used in an embodiment of the present invention is preferably a bismuth-tellurium-based thermoelectric semiconductor material such as P-type bismuth telluride or N-type bismuth telluride.

The P-type bismuth telluride is preferably one for which the carrier is a positive hole and the Seebeck coefficient is a positive value, and for example, a P-type bismuth telluride represented by $Bi_XTe_3Sb_{2-X}$ is preferably used. In this case, X is preferably $0<X\leq 0.8$, and more preferably $0.4\leq X\leq 0.6$. X of greater than 0 and 0.8 or less is preferred because the Seebeck coefficient and electrical conductivity become large, and characteristics as the P-type thermoelectric conversion material are maintained.

In addition, the N-type bismuth telluride is preferably one for which the carrier is an electron and the Seebeck coefficient is a negative value, and, for example, an N-type bismuth telluride represented by $Bi_2Te_{3-Y}Se_Y$ is preferably used. In this case, Y is preferably $0\leq Y\leq 3$ (when Y=0, $Bi_2Te_3$), and more preferably $0.1<Y\leq 2.7$. Y of 0 or greater and 3 or less is preferred because the Seebeck coefficient and electrical conductivity become large, and characteristics as the N-type thermoelectric conversion material are maintained.

An amount of the thermoelectric semiconductor particles blended in the thermoelectric semiconductor composition is preferably from 30 to 99 mass %. The compounded amount thereof is more preferably from 50 to 96 mass %, and even more preferably from 70 to 95 mass %. If the compounded amount of the thermoelectric semiconductor particles is within the range described above, the Seebeck coefficient (absolute value of the Peltier coefficient) is large, a decrease in electrical conductivity is suppressed, and only thermal conductivity is reduced, and therefore a film exhibiting high thermoelectric performance and having sufficient film strength and flexibility is obtained. Thus, the compounded amount of the thermoelectric semiconductor particles is preferably within the range described above.

The average particle size of the thermoelectric semiconductor particles is preferably from 10 nm to 200 µm, more preferably from 10 nm to 30 µm, even more preferably from 50 nm to 10 µm, and particularly preferably from 1 to 6 µm. When the average particle size is in the range above, uniform dispersion is facilitated and a high electrical conductivity can be achieved.

The method of obtaining the thermoelectric semiconductor particles by pulverizing the thermoelectric semiconductor material is not particularly limited, and the thermoelectric semiconductor material may be pulverized to a predetermined size by a known micropulverizer, such as a jet mill, a ball mill, a bead mill, a colloid mill, a conical mill, a disc mill, an edge mill, a powdering mill, a hammer mill, a pellet mill, a whirly mill, or a roller mill.

Note that the average particle size of the thermoelectric semiconductor particles is obtained by measuring using a laser diffraction particle size analyzer (Mastersizer 3000 available from Malvern Panalytical Ltd.), and using the median from the particle size distribution.

Furthermore, the thermoelectric semiconductor particles are preferably subjected to an annealing treatment (hereinafter, also referred to as an "annealing treatment A"). When the thermoelectric semiconductor particles are subjected to the annealing treatment A, the crystallinity of the thermoelectric semiconductor particles is improved, and, further, a surface oxide film of the thermoelectric semiconductor particles is removed. Therefore, the Seebeck coefficient (absolute value of the Peltier coefficient) of the thermoelectric conversion material increases, and the thermoelectric performance index can be further improved. The annealing treatment A is not particularly limited, but is preferably implemented prior to preparation of the thermoelectric semiconductor composition and is implemented in an atmosphere of inert gas such as nitrogen or argon with the gas flow rate controlled, or similarly, in an atmosphere of a reducing gas such as hydrogen, or in vacuum conditions, so as to not adversely affect the thermoelectric semiconductor particles, and is more preferably implemented in a mixed gas atmosphere of an inert gas and a reducing gas. The specific temperature conditions depend on the thermoelectric semiconductor particles that are used, but typically the annealing treatment A is preferably implemented for several minutes to several tens of hours at a temperature that is equal to or lower than the melting point of the particles and is from 100 to 1500° C.

(Heat Resistant Resin A)

The heat resistant resin A used in an embodiment of the present invention serves as a binder among the thermoelectric semiconductor particles, and is to increase the bendability of the thermoelectric element layer. The heat resistant resin A is not particularly limited; however, when thermoelectric semiconductor particles undergo crystal growth by annealing a thin film including the thermoelectric semiconductor composition, a heat resistant resin A does not lose but maintains various physical properties as a resin such as mechanical strength and thermal conductivity.

Examples of the heat resistant resin A include polyamide resins, polyamide-imide resins, polyimide resins, polyetherimide resins, polybenzoxazole resins, polybenzimidazole resins, epoxy resins, and copolymers having chemical structures of these resins. The heat resistant resin A may be used alone, or a combination of two or more types of the heat resistant resins A may be used. Among these resins, from the perspective of further increasing heat resistance and not adversely affecting crystal growth of the thermoelectric semiconductor particles in the thin film, the heat resistant resin A is preferably a polyamide resin, a polyamide-imide resin, a polyimide resin, or an epoxy resin, and, from the perspective of excelling in bendability, the heat resistant resin A is more preferably a polyamide resin, a polyamide-imide resin, or a polyimide resin. When a polyimide film is used as the support described above, the heat resistant resin A is more preferably a polyimide resin from perspectives such as adherence with the polyimide film. Note that in an embodiment of the present invention, the term polyimide resin is used as a general term for polyimides and precursors thereof.

The heat resistant resin A preferably has a decomposition temperature of 300° C. or higher. If the decomposition temperature is within the range described above, even when the thin film including the thermoelectric semiconductor composition is subjected to an annealing treatment as will be described below, the bendability of the thermoelectric element layer can be maintained without loss of function as a binder.

In addition, the heat resistant resin A has a mass reduction ratio at 300° C. of preferably 10% or less, more preferably 5% or less, and even more preferably 1% or less, as measured by thermogravimetry (TG). If the mass reduction ratio is in the range described above, even when the thin film including the thermoelectric semiconductor composition is subjected to an annealing treatment as will be described below, the bendability of the thermoelectric element layer can be maintained without loss of function as a binder.

An amount of the heat resistant resin A blended in the thermoelectric semiconductor composition is preferably from 0.1 to 40 mass %, more preferably from 0.5 to 20 mass %, and even more preferably from 1 to 20 mass %. When the amount of the heat resistant resin A blended is within the range described above, a film that has both high thermoelectric performance and film strength can be produced.

Ionic Liquid

The ionic liquid that may be contained in the thermoelectric semiconductor composition is a molten salt obtained by combining a cation and an anion and means a salt that can be present as a liquid in any temperature region in −50° C. or higher and lower than 400° C. In other words, the ionic liquid is an ionic compound having a melting point in the range of −50° C. or higher and lower than 400° C. The melting point of the ionic liquid is preferably −25° C. or higher and 200° C. or lower, and more preferably 0° C. or higher and 150° C. or lower. Because the ionic liquid has characteristics such as having a significantly low vapor pressure and being nonvolatile, having excellent thermal stability and electrochemical stability, having a low viscosity, and having a high ionic conductivity, the ionic liquid can effectively suppress reduction of the electrical conductivity between the thermoelectric semiconductor materials as a conductivity aid. Furthermore, because the ionic liquid exhibits high polarity based on the aprotic ionic structure and has excellent compatibility with the heat resistant resin A, the electrical conductivity of the thermoelectric conversion material can be made uniform.

As the ionic liquid, a known or commercially available ionic liquid can be used. Examples thereof include those formed from nitrogen-containing cyclic cation compounds and derivatives thereof, such as pyridinium, pyrimidinium, pyrazolium, pyrrolidinium, piperidinium, and imidazolium;

tetraalkylammonium-based amine cations and derivatives thereof; phosphine cations and derivatives thereof, such as phosphonium, trialkylsulfonium, and tetraalkylphosphonium; cation components, such as lithium cation and derivatives thereof; and anion components, such as Cl$^-$, Br$^-$, I$^-$, AlCl$_4^-$, Al$_2$Cl$_7^-$, BF$_4^-$, PF$_6^-$, ClO$_4^-$, NO$_3^-$, CH$_3$COO$^-$, CF$_3$COO$^-$, CH$_3$SO$_3^-$, CF$_3$SO$_3^-$, (FSO$_2$)$_2$N$^-$, (CF$_3$SO$_2$)$_2$N$^-$, (CF$_3$SO$_2$)$_3$C$^-$, AsF$_6^-$, SbF$_6^-$, NbF$_6^-$, TaF$_6^-$, F(HF)$_n^-$, (CN)$_2$N$^-$, C$_4$F$_9$SO$_3^-$, (C$_2$F$_5$SO$_2$)$_2$N$^-$, C$_3$F$_7$COO$^-$, and (CF$_3$SO$_2$)(CF$_3$CO)N$^-$.

In the ionic liquid described above, from the perspective of high temperature stability, compatibility between the thermoelectric semiconductor material and the resin, suppression of reduction of the electrical conductivity between the thermoelectric semiconductor materials, and the like, the cation component of the ionic liquid preferably contains at least one type selected from the group consisting of pyridinium cations and derivatives thereof and imidazolium cations and derivatives thereof.

Specific examples of ionic liquids in which the cationic component includes pyridinium cations or derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butylpyridinium bromide, 1-butyl-4-methylpyridinium bromide, and 1-butyl-4-methylpyridinium hexafluorophosphate. Among these, 1-butyl-4-methylpyridinium bromide, 1-butylpyridinium bromide, and 1-butyl-4-methylpyridinium hexafluorophosphate are preferred.

Furthermore, specific examples of the ionic liquid in which the cation component contains the imidazolium cation and derivatives thereof include [1-butyl-3-(2-hydroxyethyl) imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl methylimidazolium chloride, 1-ethyl-3-methylimidazolium tetrafluoroborate, 1-butyl methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methyl sulfate, and 1,3-dibutylimidazolium methyl sulfate. Among these, [1-butyl-3-(2-hydroxyethyl)imidazolium bromide] and [1-butyl-3-(2-hydroxyethyl)imidazolium tetrafluoroborate] are preferred.

The ionic liquid described above preferably has an electrical conductivity of $10^{-7}$ S/cm or higher. When the ionic conductivity is within the range described above, the ionic liquid can effectively suppress reduction of the electrical conductivity between the thermoelectric semiconductor materials as a conductivity aid.

Furthermore, the ionic liquid described above preferably has a decomposition temperature of 300° C. or higher. When the decomposition temperature is in the range described above, as described below, even in a case where a thin film including the thermoelectric semiconductor composition is subjected to annealing treatment, effect as the conductivity aid can be maintained.

Furthermore, for the ionic liquid, the mass reduction ratio at 300° C. measured by thermogravimetry (TG) is preferably 10% or less, more preferably 5% or less, and even more preferably 1% or less. When the mass reduction ratio is in the range described above, as described below, even in a case where a thin film including the thermoelectric semiconductor composition is subjected to annealing treatment, effect as the conductivity aid can be maintained.

The blended amount of the ionic liquid in the thermoelectric semiconductor composition is preferably from 0.01 to 50 mass %, more preferably from 0.5 to 30 mass %, and even more preferably from 1.0 to 20 mass %. When the blended amount of the ionic liquid is in the range described above, reduction of the electrical conductivity is effectively suppressed, and a film having a high thermoelectric performance can be obtained.

Inorganic Ionic Compound

The inorganic ionic compound used in an embodiment of the present invention is a compound constituted from at least a cation and an anion. The inorganic ionic compound is a solid at room temperature, has a melting point at any temperature in a temperature range from 400 to 900° C., and exhibits high ionic conductivity, and therefore as conductivity aid, the inorganic ionic compound can suppress a reduction in electrical conductivity between the thermoelectric semiconductor particles.

The compounded amount of the inorganic ionic compound in the thermoelectric semiconductor composition is preferably from 0.01 to 50 mass %, more preferably from 0.5 to 30 mass %, and even more preferably from 1.0 to 10 mass %. If the compounded amount of the inorganic ionic compound is within the range described above, a reduction in electrical conductivity can be effectively suppressed, and as a result, a film with improved thermoelectric performance can be obtained.

Note that when the inorganic ionic compound and the ionic liquid are used in combination, the total amount of the inorganic ionic compound and the ionic liquid in the thermoelectric semiconductor composition is preferably from 0.01 to 50 mass %, more preferably from 0.5 to 30 mass %, and even more preferably from 1.0 to 10 mass %.

A thickness of the thermoelectric element layer is not particularly limited, but, from the perspective of thermoelectric performance and film strength, is preferably from 100 nm to 1000 µm, more preferably from 300 nm to 600 µm, and even more preferably from 5 to 400 µm.

The P-type thermoelectric element layer and the N-type thermoelectric element layer which are thin films including the thermoelectric semiconductor composition are preferably further subjected to an annealing treatment (hereinafter, sometimes referred to as "annealing treatment B"). By subjecting the chip to the annealing treatment B, the thermoelectric performance can be stabilized, crystal growth of the thermoelectric semiconductor particles in the thin film can be promoted, and the thermoelectric performance can be further improved. The annealing treatment B is not particularly limited, but is ordinarily implemented in an atmosphere with the gas flow rate controlled, including in an inert gas atmosphere such as nitrogen or argon or in a reducing gas atmosphere, or is implemented under vacuum conditions, and while dependent on factors such as the heat resistance temperatures of the resin and ionic compound that are used, the annealing treatment B is typically implemented at a temperature of from 100 to 500° C. for several minutes to several tens of hours.

<Electrode>

The thermoelectric conversion module according to an embodiment of the present invention preferably includes a first electrode. When configured as a π-type thermoelectric conversion element, the thermoelectric conversion module preferably further includes a second electrode on a second base material which is provided opposing a first base material having the first electrode. The first electrode and the second electrode on the second base material which is provided opposing the first base material may be identical or different. In addition, when the thermoelectric conversion module is configured as an in-plane type thermoelectric conversion element, the second electrode may be or may not be provided, as long as the first electrode is provided.

Metal materials used in the first electrode and the second electrode are not particularly limited, but, preferably, are each independently copper, gold, nickel, aluminum, rhodium, platinum, chromium, palladium, stainless steel, molybdenum, or an alloy containing any of these metals. In addition, a single layer may be used, but also a plurality of layers may be combined to form a multilayer configuration.

The thicknesses of the layers of the first electrode and the second electrode are each independently preferably from 10 nm to 200 μm, more preferably from 30 nm to 150 μm, and even more preferably from 50 nm to 120 μm. When the thicknesses of the layers of the first and second electrodes are within the range described above, electrical conductivity is high, resistance is low, and sufficient strength of the electrodes is obtained.

The first electrode and the second electrode are formed using the metal material described above. A method for forming the first and second electrodes is, for example, a method including forming an electrode on which no pattern is formed on a base material, and processing the electrodes into a predetermined pattern shape by a known physical treatment or chemical treatment mainly using a photolithography or a combination thereof, or a method including forming an electrode having a pattern directly by screen printing, an inkjet method, or the like.

Examples of methods for forming an electrode having on which no pattern is formed include dry processes including physical vapor deposition (PVD) methods, such as vacuum vapor deposition, sputtering, and ion plating or chemical vapor deposition (CVD) methods, such as thermal CVD and atomic layer deposition (ALD); and wet processes including various coating methods, such as dip coating, spin coating, spray coating, gravure coating, die coating, and doctor blade coating, and electrodeposition methods; silver salt methods; electrolytic plating; electroless plating; and lamination of metal foils. The method is appropriately selected according to the material for the electrode.

From the perspective of thermoelectric performance, the electrodes are required to exhibit high electrical conductivity and high thermal conductivity, and therefore electrodes that have been film-formed by plating or a vacuum film formation method are preferably used. Since high conductivity and high thermal conductivity can be easily achieved, vacuum film formation methods such as vacuum vapor deposition and sputtering, electrolytic plating; and electroless plating are preferred. A pattern can be easily formed through a hard mask such as a metal mask depending on the dimensions of the pattern to be formed and the required dimensional accuracy.

The thermoelectric conversion module according to an embodiment of the present invention is not particularly limited, but is preferably composed of a π-type thermoelectric conversion element or an in-plane type thermoelectric conversion element. In an aspect, the thermoelectric conversion module is preferably used, with a configuration of the π-type thermoelectric conversion element or the in-plane type thermoelectric conversion element, in a cooling application. Further, as another aspect, the thermoelectric conversion module is preferably used, with the configuration of the π-type thermoelectric conversion element or the in-plane type thermoelectric conversion element, in a power generation application.

(Method for Producing the Thermoelectric Conversion Module)

The thermoelectric conversion module according to an embodiment of the present invention can be produced by a method including: a step of forming an electrode on a base material (hereinafter sometimes referred to as "electrode formation step"); a step of applying the thermoelectric semiconductor composition, drying the composition, and forming a thermoelectric element layer (hereinafter sometimes referred to as "thermoelectric element layer formation step"); a step of subjecting the thermoelectric element layer to an annealing treatment (hereinafter, sometimes referred to as "annealing treatment step"); and a step of bonding the base material subjected to the annealing treatment with another base material (hereinafter, sometimes referred to as "bonding step").

The steps included in the method for manufacturing a thermoelectric conversion module according to an embodiment of the present invention will be described sequentially.

(Electrode Formation Step)

The electrode formation step is, for example, a step of forming a pattern formed from the metal material described above on a first base material, and the method for forming an electrode on a base material and the method for forming a pattern are as described above. In particular, when the π-type thermoelectric conversion module or the like described above is produced, the method includes a step of forming a pattern formed from the metal material described above on a second base material which is provided opposing the first base material.

(Thermoelectric Element Layer Formation Step)

The thermoelectric element layer formation step is, for example, a step of applying a thermoelectric semiconductor composition onto the electrode. The method for applying the thermoelectric semiconductor composition onto the electrode on the first base material is not particularly limited, and examples thereof include known methods such as screen printing, flexographic printing, gravure printing, spin coating, dip coating, die coating, spray coating, bar coating, and doctor blade coating. When the coating is to be formed in a pattern, a method such as screen printing or slot die coating by which the pattern can be easily formed using a screen plate having the desired pattern is preferably used.

The resulting coating film is then dried to form a thermoelectric element layer. As the drying method, a well-known drying method can be used, such as hot air drying, heated roll drying, and infrared irradiation. The heating temperature is typically from 80 to 150° C., and while the heating time differs depending on the heating method, the heating time is typically from tens of seconds to tens of minutes.

Furthermore, when a solvent is used in the preparation of the thermoelectric semiconductor composition, the heating temperature is not particularly limited as long as the temperature is within a temperature range in which the solvent that is used can be dried.

The same applies to the case where the thermoelectric semiconductor composition is applied onto the electrode on the second base material.

Another example of the thermoelectric element layer formation step is a method including: preparing a thermoelectric element layer as a chip of thermoelectric conversion material in advance; placing a plurality of the prepared chips on predetermined electrodes on a base material and joining the chips to the electrodes.

As the method for manufacturing the chip of the thermoelectric conversion material, for example, a chip of a thermoelectric conversion material including a thermoelectric semiconductor composition can be produced by the following method.

First, a sacrificial layer is formed on a substrate made of glass, alumina, silicon, or the like, and a thermoelectric element layer (hereinafter sometimes referred to as "chip of the thermoelectric conversion material") is formed on the formed sacrificial layer in the manner described above. Next, the prepared chip of the thermoelectric conversion material is subjected to an annealing treatment (according to conditions for the annealing treatment B). Then, the chip of the thermoelectric conversion material is peeled from the sacrificial layer on the substrate, and thus the chip of the thermoelectric conversion material is prepared as a piece.

As the sacrificial layer, a resin such as poly(methyl methacrylate) or polystyrene, or a release agent such as a fluorine-based release agent or a silicone-based release agent is used.

(Annealing Treatment Step)

The annealing treatment step is, for example, a step of subjecting the thermoelectric element layer to an annealing treatment, in such a form that the first base material, the electrode, and the thermoelectric element layer obtained above are provided in this order. The annealing treatment is performed as the annealing treatment B described above.

(Bonding Step)

The bonding step is, for example, a step of bonding the first base material having the electrode and the thermoelectric element layer obtained in the annealing treatment step with the opposing second base material or a second base material having a second electrode, and producing a thermoelectric conversion module.

Examples of a bonding agent used in the bonding include an electrically conductive paste, in a case of a second base material having a second electrode. Examples of the electrically conductive paste include copper paste, silver paste, and nickel paste. When a binder is used, examples thereof include an epoxy resin, an acrylic resin, and a urethane resin.

In a case of a second base material having no second electrode, a resin material can be used. The resin material preferably includes a polyolefin-based resin, an epoxy-based resin, or an acrylic resin. Furthermore, the resin material preferably has adhesiveness, low water vapor permeability, and insulating properties. In the present specification, "adhesiveness" means that the resin material has pressure sensitive adhesion, adhesion, and pressure sensitive adhesion which is adhesion due to pressure sensitivity in an early stage of pasting.

Examples of methods for applying the bonding agent onto the base material include known methods such as screen printing and dispensing methods.

When a solder material layer is used for joining with the electrode in the bonding step, a solder receiving layer can be used in order to improve joining strength.

For example, a method for forming a solder receiving layer on the chip of the thermoelectric conversion material obtained in the manufacturing method described above is as follows.

The solder receiving layer is formed by: forming solder receiving layers on all surfaces of the chip of the thermoelectric conversion material having an upper surface, a bottom surface, and side surfaces; and then removing all or a part of the solder receiving layers formed on the side surfaces of the chip of the thermoelectric conversion material, among the obtained solder receiving layers.

The solder receiving layer preferably contains a metal material. The metal material is preferably at least one type selected from the group consisting of gold, silver, rhodium, platinum, chromium, palladium, tin, nickel, and alloys containing these metal materials. Among them, the metal material is more preferably gold, silver, or nickel, or has a two-layer structure of tin and gold, or nickel and gold. Silver is even more preferred from perspectives of material cost, high thermal conductivity, and joining stability.

From the perspective of maintenance of thermoelectric performance, the solder receiving layer is required to exhibit high electrical conductivity and high thermal conductivity. Also, from the perspective of reduction in contact resistance at an interface with the chip of the thermoelectric conversion material, a solder receiving layer film-formed by plating or a vacuum film formation method is preferably used as the solder receiving layer.

A solder material constituting the solder material layer may be appropriately selected in consideration of a heat resistant temperature and the like of the heat resistant resin A included in a resin film and the chip of the thermoelectric conversion material, electrical conductivity, and thermal conductivity. Examples thereof include known materials such as Sn, Sn/Pb alloys, Sn/Ag alloys, Sn/Cu alloys, Sn/Sb alloys, Sn/In alloys, Sn/Zn alloys, Sn/In/Bi alloys, Sn/In/Bi/Zn alloys, Sn/Bi/Pb/Cd alloys, Sn/Bi/Pb alloys, Sn/Bi/Cd alloys, Bi/Pb alloys, Sn/Bi/Zn alloys, Sn/Bi alloys, Sn/Bi/Pb alloys, Sn/Pb/Cd alloys, and Sn/Cd alloys. An alloy such as a 43Sn/57Bi alloy, a 42Sn/58Bi alloy, a 40Sn/56Bi/4Zn alloy, a 48Sn/52In alloy, or a 39.8Sn/52In/7Bi/1.2Zn alloy is preferred from the perspective of lead-free and/or cadmium-free, melting point, electrical conductivity, and thermal conductivity.

Examples of methods for applying the solder material onto the electrodes on the base material include known methods such as screen printing and dispensing methods.

According to the method for manufacturing a thermoelectric conversion module according to an embodiment of the present invention, it is possible to easily obtain a thermoelectric conversion module with bendability, having an improved thermoelectric performance.

EXAMPLES

The present invention will now be described in greater detail by way of examples, but the present invention is not limited by these examples.

The base materials used in the Example and the Comparative Example and the thermoelectric performance of the produced thermoelectric conversion modules were evaluated by the following methods.

<Evaluation of Base Material>

(a) Thermal Conductivity and Thermal Resistance of Base Material

The thermal conductivity of the base material was measured at 23° C. using a thermal conductivity measurement device (available from ADVANCE RIKO, Inc., steady-state thermal conductivity measurement device GH-1) by a disk heat flow meter method in accordance with ASTM E1530. Thermal resistance Rc [$=L/\lambda Ac$ (K/W)] was calculated from the thermal conductivity λ(W/m·K) of the obtained base material, the thickness L (m) of the base material, and the cross-sectional area (heat flow path cross-sectional area of thermal conduction) Ac (m$^2$) of the base material.
<Evaluation of Thermoelectric Performance>
(b) Evaluation of Electric Resistance of Thermoelectric Conversion Module The electric resistance (module resistance) between the extraction electrodes of the obtained thermoelectric conversion module was measured under an environment of 25° C. and 50% RH using a low resistance measurement device (model name: RM3545, available from HIOKI E. E. Corporation).
(c) Evaluation of Cooling Characteristic of Thermoelectric Conversion Module The cooling characteristics of the obtained thermoelectric conversion module were evaluated by using the cooling characteristic evaluation unit.

Figure 3:
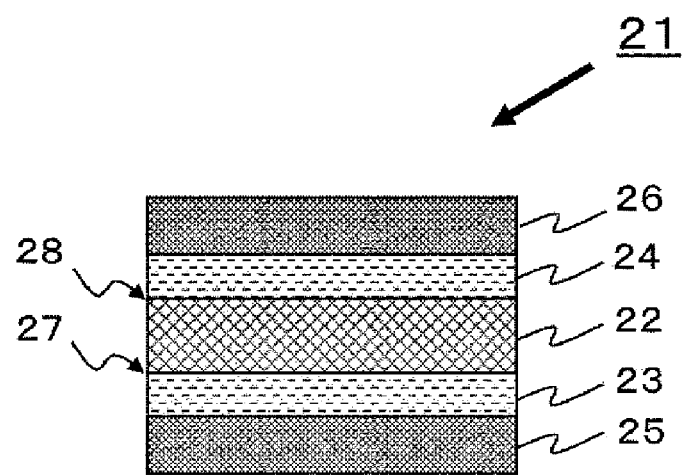
FIG. 3 is a cross-sectional diagram for illustrating a cooling characteristic evaluation unit of a thermoelectric conversion module made in an Example of the present invention.

FIG. 3 is a cross-sectional diagram for illustrating a cooling characteristic evaluation unit of a thermoelectric conversion module used in an Example.

A cooling characteristic evaluation unit 21 was composed of: a thermoelectric conversion module 22; and on both sides of the thermoelectric conversion modules 22, temperature measurement plates 23 and 24, each of which has a type K thermocouple inserted therein, and temperature controllers 25 and 26. It was heat-insulated by keeping it under vacuum (vacuum degree: 0.1 Pa or less), and adjusted by the temperature controllers 25 and 26 so that temperatures of a heat absorption surface 27 and a heat dissipation surface 28 of the thermoelectric conversion module were 85° C. Thereafter, current was applied to the thermoelectric conversion module 22, and a temperature difference between the heat absorption surface 27 and the heat dissipation surface 28 was measured. Note that, during current application, the temperature on the heat absorption surface 27 side was controlled by the temperature controllers to maintain 85° C.

Example 1

(1) Production of Thermoelectric Semiconductor Composition
(Production of Thermoelectric Semiconductor Particles)

P-type bismuth telluride $Bi_{0.4}Te_3Sb_{1.6}$, which is a bismuth-tellurium-based thermoelectric semiconductor material, (available from Kojundo Chemical Lab. Co., Ltd.; particle size: 90 μm) was pulverized in a nitrogen gas atmosphere by using a planetary ball mill (Premium line P-7, available from Fritsch Japan Co., Ltd.), and thus thermoelectric semiconductor particles T1 having an average particle size of 2.0 μm were produced.

Furthermore, N-type bismuth telluride $Bi_2Te_3$, which is a bismuth-tellurium-based thermoelectric semiconductor material, (available from Kojundo Chemical Lab. Co., Ltd.; particle size: 90 μm) was pulverized in the same manner as described above, and thus thermoelectric semiconductor particles T2 having an average particle size of 2.8 μm were produced.

The thermoelectric semiconductor particles T1 and T2 obtained by pulverization were subjected to particle size distribution measurement using a laser diffraction particle size analyzer (Mastersizer 3000 available from Malvern Panalytical Ltd.).
(Preparation of Coating Solution of Thermoelectric Semiconductor Composition) Coating Solution (P)

A coating solution (P) including a thermoelectric semiconductor composition was prepared by mixing and dispersing 72.0 parts by mass of the particles T1 of P-type bismuth telluride $Bi_{0.4}Te_{3.0}Sb_{1.6}$ obtained above, 15.5 parts by mass of polyamide-imide (Compolasen AI301 available from Arakawa Chemical Industries, Ltd., solvent: N-methylpyrrolidone, solid content concentration: 19 mass %) as the heat resistant resin A, and 12.5 parts by mass of N-butylpyridinium bromide as the ionic liquid.
Coating Solution (N)

A coating solution (N) including a thermoelectric semiconductor composition was prepared by mixing and dispersing 78.9 parts by mass of the obtained particles T2 of N-type bismuth telluride $Bi_2Te_3$, 17.0 parts by mass of polyamide-imide (Compolasen AI301 available from Arakawa Chemical Industries, Ltd., solvent: N-methylpyrrolidone, solid content concentration: 19 mass %) as the heat resistant resin A, and 4.1 parts by mass of N-butylpyridinium bromide as the ionic liquid.
(2) Formation of Thin Film of Thermoelectric Conversion Material On a glass substrate (Trade name: Aoita glass, available from KAWAMURA KYUZO SHOTEN Co., Ltd.) having a thickness of 0.7 mm, a film was formed, as the sacrificial layer, by applying a polymethyl methacrylate resin solution having a solid content concentration of 10 mass %, in which a polymethyl methacrylate resin (PMMA) (trade name: Polymethyl Methacrylate, available from Sigma-Aldrich Co. LLC.) was dissolved in toluene, by a spin coating method, so that the thickness after drying was 3.0 μm.

The coating solution (P) prepared in the above (1) was applied onto the sacrificial layer via a metal mask by screen printing, and dried at a temperature of 125° C. for 15 minutes in an argon atmosphere, and a thin film having a thickness of 270 μm was formed. Then, the obtained thin film was heated at a heating rate of 5 K/min in an atmosphere of a mixed gas of hydrogen and argon (hydrogen: argon=3 vol %: 97 vol %), and held at 450° C. for 1 hour. The thin film was subjected to an annealing treatment to crystal-grow particles of a thermoelectric semiconductor material. Thus, obtained was a chip of a P-type thermoelectric conversion material having a rectangular parallelepiped shape with upper and lower surfaces of 1.65 mm×1.65 mm and a thickness of 200 μm, containing P-type bismuth telluride $Bi_{0.4}Te_3Sb_{1.6}$.

In addition, a chip of an N-type thermoelectric conversion material having a rectangular parallelepiped shape with upper and lower surfaces of 1.65 mm×1.65 mm and a thickness of 250 μm, containing N-type bismuth telluride $Bi_2Te_3$ was obtained by the same procedure, except that the coating solution (P) was changed to the coating solution (N) prepared in the above (1), and that the coating liquid (N) was dried at 125° C. for 7 minutes in an argon atmosphere.
(3) Formation of Solder Receiving Layer The chips of the P-type and N-type thermoelectric conversion materials after the annealing treatment were peeled from the glass substrate, and solder receiving layers [Au (thickness: 30 nm) was laminated onto Ni (thickness: 2 μm)] were provided on all surfaces of the chips of the P-type and N-type thermoelectric conversion materials by electroless plating.

Then, the solder receiving layers on the side surfaces of the chips of the P-type and N-type thermoelectric conversion materials were removed by a mechanical polishing method, that is, using a sandpaper (2000 grit) such that the chips had dimensions of 1.5 mm×1.5 mm, and thus chips of the P-type and N-type thermoelectric conversion materials having solder receiving layers only on the upper and lower surfaces were obtained. In order to completely remove the solder receiving layers, a part of the side walls was also polished.

<Production of Thermoelectric Conversion Module>

Using the obtained chips of the P-type and N-type thermoelectric conversion materials having solder receiving layers only on the upper and lower surfaces, a π-type thermoelectric conversion element including 18 pairs of the chips of the P-type and N-type thermoelectric conversion materials was produced as follows.

First, a high thermal conductive substrate having copper foils attached to both sides thereof (product name: CS-3295, available from RISHO KOGYO CO., LTD.; 10 mm×20 mm, thickness: 60 μm; copper foil, thickness: 35 μm) was provided. A nickel layer (thickness of 3 μm) and a gold layer (thickness of 40 nm) were laminated, in this order, on the copper foil of the high thermal conductive substrate by electroless plating. Next, an electrode pattern (1.5×3.2 mm, distance between adjacent electrodes: 0.2 mm, 6 columns×3 rows) was formed on only one surface, and a substrate having electrodes was produced (lower electrode substrate). Thereafter, a solder material layer was stencil-printed (thickness before heating: 50 μm) on the electrodes using solder paste a 42Sn/57Bi/Ag alloy (product name: PF 141-LT7H0, available from NIHON HANDA Inc.) as a solder material.

Next, one surface of each solder receiving layer of the chips of the P-type and N-type thermoelectric conversion materials obtained as described above was placed on the solder material layer, heated at 180° C. for 1 minute, and then cooled (thickness of the solder material layer after heating and cooling: 30 μm), and thus the chips of the P-type and N-type thermoelectric conversion materials were disposed on the electrodes.

Further, the solder paste was printed (thickness before heating: 50 μm) as a solder material layer on the other surface of each solder receiving layer of the chips of the P-type and N-type thermoelectric conversion materials, and the obtained solder material layer and the electrode on the upper electrode substrate (electrode substrate in which electrodes were disposed in a pattern such that a π-type thermoelectric conversion module was obtained when the upper electrode substrate was bonded to the lower electrode substrate; identical with the lower electrode substrate in substrate and electrode materials, thicknesses and the like) were bonded together and heated at 190° C. for 2 minutes to obtain a π-type thermoelectric conversion module including 18 pairs of the chips of the P-type and N-type thermoelectric conversion materials.

For the obtained thermoelectric conversion module, the module resistance (electric resistance) and the temperature difference ΔT between the heat absorption surface and the heat dissipation surface were evaluated under the evaluation conditions described above. The evaluation results are shown in Table 1, including thermal conductivity and thermal resistance.

Comparative Example 1

The thermoelectric conversion module of Comparative Example 1 was produced in the same manner as in Example 1, except that the high thermal conductive substrate in Example 1 was changed to a polyimide film substrate ("Kapton" available from DU PONT-TORAY CO., LTD.; 10 mm×20 mm, thickness: 12.5 μm).

For the obtained thermoelectric conversion module, the module resistance (electric resistance) and the temperature difference ΔT between the heat absorption surface and the heat dissipation surface were evaluated under the evaluation conditions described above, in the same manner as in Example 1. The evaluation results are shown in Table 1, including thermal conductivity and thermal resistance.

[Table 1]

TABLE 1

| | | *Base material | | | Thermoelectric conversion module | | |
|---|---|---|---|---|---|---|---|
| | Material | Thermal resistance (K/W) | Thermal conductivity (W/m · K) | Thickness [μm] | Module resistance (mΩ) | Applied current (A) | Temperature difference ΔT (° C.) |
| Example 1 | CS-3295 | 0.20 | 3.0 | 60 | 311 | 5.0 | 20.9 |
| Comparative Example 1 | Polyimide | 0.45 | 0.28 | 12.5 | 319 | 4.5 | 16.2 |

*Base material evaluation is performed without copper foil.

It can be seen that the thermoelectric conversion module of Example 1, which included, as the base material, a high thermal conductive base material having bendability, exhibited a large temperature difference, hence a superior cooling performance, compared to that of the thermoelectric conversion module of Comparative Example 1, which included, as the base material, a known base material, that is, a low thermal conductive polyimide film.

INDUSTRIAL APPLICABILITY

The thermoelectric conversion module according to an embodiment of the present invention has bendability and excellent thermoelectric performance, and thus can be used, for example, in applications of suppressing storage of heat generated in miniaturization and thinning of electronic devices and the like.

Specific examples of the applications include cooling of a Central Processing Unit (CPU) mounted on a smartphone, a tablet PC, or the like, and temperature control of various sensors represented by image sensors such as a Complementary Metal Oxide Semiconductor Image Sensor (CMOS) and a Charge Coupled Device (CCD) that are semiconductor elements.

Furthermore, it can also be applied to power generation applications of converting exhaust heat from plants and various combustion furnaces such as waste combustion furnaces and cement combustion furnaces, combustion gas exhaust heat of automobiles, and exhaust heat of electronic equipment into electricity.

REFERENCE SIGNS LIST

1: Thermoelectric conversion module
2a: First base material
2b: Second base material
3a: First electrode 3b: Second electrode
4: P-type thermoelectric element layer
5: N-type thermoelectric element layer
11: Thermoelectric conversion module
12a: First base material
12b: Second base material
13: First electrode
14: P-type thermoelectric element layer
15: N-type thermoelectric element layer
21: Cooling characteristic evaluation unit
22: Thermoelectric conversion module
23, 24: Measurement plate
25, 26: Temperature controller
27: Heat absorption surface
28: Heat dissipation surface

The invention claimed is:

1. A thermoelectric conversion module comprising: a base material; and a thermoelectric element layer including a thermoelectric semiconductor composition, wherein
the thermoelectric semiconductor composition includes a thermoelectric semiconductor material, a heat resistant resin A, and an ionic liquid and/or inorganic ionic compound, and
the base material has a thermal resistance of 0.35 K/W or less.

2. The thermoelectric conversion module according to claim 1, wherein the base material includes an insulator.

3. The thermoelectric conversion module according to claim 1, wherein the base material is flexible.

4. The thermoelectric conversion module according to claim 1, wherein the base material has a thermal conductivity of 0.5 W/m·K or greater.

5. The thermoelectric conversion module according to claim 1, wherein the base material has a thickness from 5 to 150 μm.

6. The thermoelectric conversion module according to claim 1, wherein the base material includes a glass fabric and a heat resistant resin B.

7. The thermoelectric conversion module according to claim 6, wherein the glass fabric is a glass woven fabric.

8. The thermoelectric conversion module according to claim 6, wherein the heat resistant resin B is an epoxy resin, a polyamide-imide resin, or a polyimide resin.

9. The thermoelectric conversion module according to claim 1, wherein the thermoelectric conversion module includes a π-type thermoelectric conversion element or an in-plane type thermoelectric conversion element.

10. The thermoelectric conversion module according to claim 9, wherein a configuration of the π-type thermoelectric conversion element or the in-plane type thermoelectric conversion element is used for cooling.

* * * * *